United States Patent
Kim et al.

(10) Patent No.: US 8,044,723 B2
(45) Date of Patent: Oct. 25, 2011

(54) OSCILLATOR SIGNAL GENERATION WITH SPUR MITIGATION IN A WIRELESS COMMUNICATION DEVICE

(75) Inventors: Hong Sun Kim, San Jose, CA (US); Jin Wook Kim, San Jose, CA (US); Gang Zhang, San Diego, CA (US); Jeremy Darren Dunworth, San Diego, CA (US); Timothy Paul Pals, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 133 days.

(21) Appl. No.: 11/868,824

(22) Filed: Oct. 8, 2007

(65) Prior Publication Data
US 2009/0072912 A1    Mar. 19, 2009

Related U.S. Application Data

(60) Provisional application No. 60/976,285, filed on Sep. 28, 2007, provisional application No. 60/972,721, filed on Sep. 14, 2007.

(51) Int. Cl.
*H03L 7/107* (2006.01)
(52) U.S. Cl. ............. 331/17; 331/185; 327/156; 455/76
(58) Field of Classification Search .................... 331/16, 331/17, 44, 179, 185, 186; 327/156, 157; 455/76, 86
See application file for complete search history.

(56) References Cited

U.S. PATENT DOCUMENTS

| | | | |
|---|---|---|---|
| 5,999,353 A | 12/1999 | Hase et al. | |
| 6,188,288 B1 * | 2/2001 | Ragan et al. | 331/16 |
| 6,838,947 B2 * | 1/2005 | Gomez | 331/17 |
| 6,940,359 B2 | 9/2005 | Ishii | |

(Continued)

FOREIGN PATENT DOCUMENTS

| JP | 2001016103 A | 1/2001 |
|---|---|---|
| JP | 2001160752 A | 6/2001 |

OTHER PUBLICATIONS

International Search Report and Written Opinion—PCT/US2008/076085, International Search Authority—European Patent Office—Dec. 15, 2008.

(Continued)

*Primary Examiner* — Ryan Johnson
(74) *Attorney, Agent, or Firm* — Larry J. Moskowitz; Eric Ho

(57) ABSTRACT

Techniques for generating oscillator signals in a wireless communication device are described. A phase-locked loop (PLL) may be used to generate an oscillator signal for a selected frequency channel. Different PLL settings may be used for the blocks in the PLL for different frequency channels. The different PLL settings may be for different PLL loop bandwidths, different amounts of charge pump current, different frequency equations associated with different sets of high and low divider ratios, different frequency division schemes associated with different prescaler ratios and/or different integer divider ratios, high side or low side injection for a super-heterodyne receiver or transmitter, and/or different supply voltages for one or more circuit blocks such as an oscillator. A suitable set of PLL settings may be selected for each frequency channel such that adverse impact due to spurs can be mitigated.

25 Claims, 9 Drawing Sheets

U.S. PATENT DOCUMENTS

| | | |
|---|---|---|
| 7,268,630 B2 * | 9/2007 | Rhee et al. .................. 331/16 |
| 7,272,374 B2 | 9/2007 | Tuttle et al. |
| 7,408,419 B2 * | 8/2008 | Ko .................. 331/17 |
| 7,639,724 B2 | 12/2009 | Tso et al. |
| 2002/0173337 A1 * | 11/2002 | Hajimiri et al. ............. 455/552 |
| 2006/0220758 A1 * | 10/2006 | Rachedine et al. ........... 331/185 |
| 2007/0247235 A1 * | 10/2007 | Gatta .................. 331/16 |

OTHER PUBLICATIONS

Translation of Office Action in Japan application 2010-525007 corresponding to US application 11/868,824, citing US20060003722, US20030080817, JP2001160752, US20050080564 and JP2001016103 dated Jan. 25, 2011.

* cited by examiner

| Frequency Channel | PLL Loop Bandwidth | Frequency Equation ($N_L$, $N_H$) | Frequency Division Scheme ($P_k$, $M_k$) | Low side or High side Injection | Overall Divider Ratio $R_k$ | VCO Supply Voltage |
|---|---|---|---|---|---|---|
| CDMA Channel 1 | $BW_{C1}$ | $N_{L\_C1}$, $N_{H\_C1}$ | $P_{C1}$, $M_{C1}$ | - | $R_{C1}$ | $V_{DD\_C1}$ |
| ... | ... | ... | ... | ... | ... | ... |
| CDMA Channel U | $BW_{CU}$ | $N_{L\_CU}$, $N_{H\_CU}$ | $P_{CU}$, $M_{CU}$ | - | $R_{CU}$ | $V_{DD\_CU}$ |
| GSM Channel 1 | $BW_{G1}$ | $N_{L\_G1}$, $N_{H\_G1}$ | $P_{G1}$, $M_{G1}$ | Low-side | $R_{G1}$ | $V_{DD\_G1}$ |
| ... | ... | ... | ... | ... | ... | ... |
| GSM Channel V | $BW_{GV}$ | $N_{L\_GV}$, $N_{H\_GV}$ | $P_{GV}$, $M_{GV}$ | High-side | $R_{GV}$ | $V_{DD\_GV}$ |
| Broadcast Channel 1 | $BW_{B1}$ | $N_{L\_B1}$, $N_{H\_B1}$ | $P_{B1}$, $M_{B1}$ | High-side | $R_{B1}$ | $V_{DD\_B1}$ |
| ... | ... | ... | ... | ... | ... | ... |
| Broadcast Channel Z | $BW_{BZ}$ | $N_{L\_BZ}$, $N_{H\_BZ}$ | $P_{BZ}$, $M_{BZ}$ | Low-side | $R_{BZ}$ | $V_{DD\_BZ}$ |

OSCILLATOR SIGNAL GENERATION WITH SPUR MITIGATION IN A WIRELESS COMMUNICATION DEVICE

The present application claims priority to provisional U.S. Application Ser. No. 60/972,721, entitled "LO SIGNAL GENERATION WITH SPUR MITIGATION IN A WIRELESS COMMUNICATION DEVICE," filed Sep. 14, 2007, assigned to the assignee hereof and incorporated herein by reference and provisional U.S. Application Ser. No. 60/976,285, entitled "LO SIGNAL GENERATION WITH SPUR MITIGATION IN A WIRELESS COMMUNICATION DEVICE," filed Sep. 28, 2007, assigned to the assignee hereof and incorporated herein by reference

BACKGROUND

I. Field

The present disclosure relates generally to electronics, and more specifically to techniques for generating oscillator signals in a wireless communication device.

II. Background

A wireless communication device (e.g., a cellular phone) may have a transmitter and a receiver to support two-way radio communication with a wireless communication system. For data transmission, the transmitter may upconvert an output baseband signal with one or more transmit local oscillator (LO) signals to obtain an upconverted signal. The transmitter may further filter and amplify the upconverted signal to obtain an output radio frequency (RF) signal and may then transmit this signal via a wireless channel to base stations in the wireless system. For data reception, the receiver may receive signals from base stations and obtain a received RF signal. The receiver may amplify, filter and downconvert the received RF signal with one or more receive LO signals to obtain an input baseband signal. The LO signals may be generated based on oscillator signals, which may be generated by oscillators within the wireless device.

The wireless device typically includes various analog circuits to condition analog signals in the transmitter and receiver. The analog circuits may include amplifiers, mixers, filters, phase-locked loops (PLLs), LO generators, etc. The analog circuits may operate on analog signals with small signal levels. Hence, the analog circuits should be exposed to as little noise as possible in order to preserve signal quality and achieve good performance.

The wireless device also typically includes digital circuitry to digitally process data being transmitted and/or received. The digital circuitry may include processors, memories, controllers, etc., which may operate based on clocks. Digital circuits typically have large signal swings and generate lots of digital noise including spurs. A spur is an undesired signal at a specific frequency or tone and generated within the wireless device. Spurs may be generated by clocks, by mixing between clocks and oscillator signals, etc. The spurs from the digital circuits may have large levels because of the large and sharp signal swings of the digital circuits.

The spurs from the digital circuits may degrade the performance of the analog circuits in various manners. First, the oscillator signals used to generate the LO signals for frequency conversion by the analog circuits may contain the spurs, which may then degrade a desired signal being received or transmitted. Second, the spurs may mix with out-of-band signal components and generate inband noise that may degrade the signal-to-noise ratio (SNR) of the desired signal. Third, the spurs may appear at the receiver inputs and/or transmitter outputs in a frequency band of interest due to substrate or package coupling paths when the analog and digital circuits are integrated in the same integrated circuit (IC) and thereby degrade the SNR of the desired signal.

To mitigate the adverse effects due to spurs, the analog circuits may be isolated from the digital circuits, which may then reduce the coupling of the spurs from the digital circuits to the analog circuits. This isolation may be achieved by (i) implementing the analog and digital circuits on separate printed circuit boards or separate sections of a printed circuit board or (ii) implementing the analog circuits on one or more analog integrated circuit (IC) dies and implementing the digital circuits on one or more digital IC dies. However, it may be difficult to achieve the desired amount of isolation or to even predict the amount of isolation that can be achieved due to limitations of design tools. Furthermore, it may be desirable to integrate the analog and digital circuits (e.g., on the same IC die) in order to reduce size and cost. Thus, techniques that can mitigate the adverse effects of spurs are highly desirable.

SUMMARY

Techniques for generating oscillator signals in a wireless communication device with non-uniform frequency programming in order to mitigate the deleterious effects of spurs are described herein. A PLL may be used to generate an oscillator signal for a selected frequency channel. The PLL may include a phase frequency detector, a charge pump, a loop filter, and a divider. With non-uniform frequency programming, different PLL settings may be used for the various blocks in the PLL for different frequency channels. In general, a PLL setting may be for any parameter affecting the generation of an oscillator signal. A suitable set of PLL settings may be selected for each frequency channel such that the adverse effects of spurs can be mitigated and good performance can be achieved for the frequency channel.

In an aspect, different PLL loop bandwidths may be supported, and a suitable PLL loop bandwidth may be selected for each frequency channel. A narrow loop bandwidth may be selected when spurs are outside of the loop bandwidth in order to attenuate the spurs. A wider loop bandwidth may be used when spurs outside the loop bandwidth are not present at problematic frequencies in order to better suppress non-spurious noise sources, such as an oscillator. The loop bandwidth may be varied, e.g., by adjusting the amount of charge pump current.

In another aspect, different frequency equations may be supported, and a suitable frequency equation may be selected for each frequency channel. The different frequency equations may be associated with different sets of high and low divider ratios in a fractional-N divider. Different spurs and/or different spur levels may be present for different frequency equations. A frequency equation with good performance in terms of spurs may be selected for each frequency channel.

In yet another aspect, different frequency division schemes may be supported, and a suitable frequency division scheme may be selected for each frequency channel. The different frequency division schemes may be associated with different prescaler ratios and/or different integer divider ratios. Different spurs and/or different spur levels may be present for different frequency division schemes. A frequency division scheme with good performance in terms of spurs may be selected for each frequency channel.

In yet another aspect, either high side or low side injection may be selected for a frequency channel in a super-heterodyne receiver or transmitter. An LO signal is at a frequency higher than the selected frequency channel for high side injection and lower than the selected frequency channel for low side injection. High side and low side injection may be associated with different spurs and/or different spur levels. Either high side or low side injection may be selected based on performance in terms of spurs.

In yet another aspect, different supply voltages may be supported for a given circuit block, and a suitable supply voltage may be selected for the circuit block for each frequency channel. In one design, different supply voltages may be used for an oscillator. A high supply voltage may be used to increase the oscillator signal swing, which may reduce the adverse effects due to spurs. A low supply voltage may be used when large spurs are not present in order to save power.

The different PLL settings may also be for other parameters. Various aspects and features of the disclosure are described in further detail below.

BRIEF DESCRIPTION OF THE DRAWINGS

FIG. 10 shows a table of PLL settings for different frequency channels.

DETAILED DESCRIPTION

Figure 1:
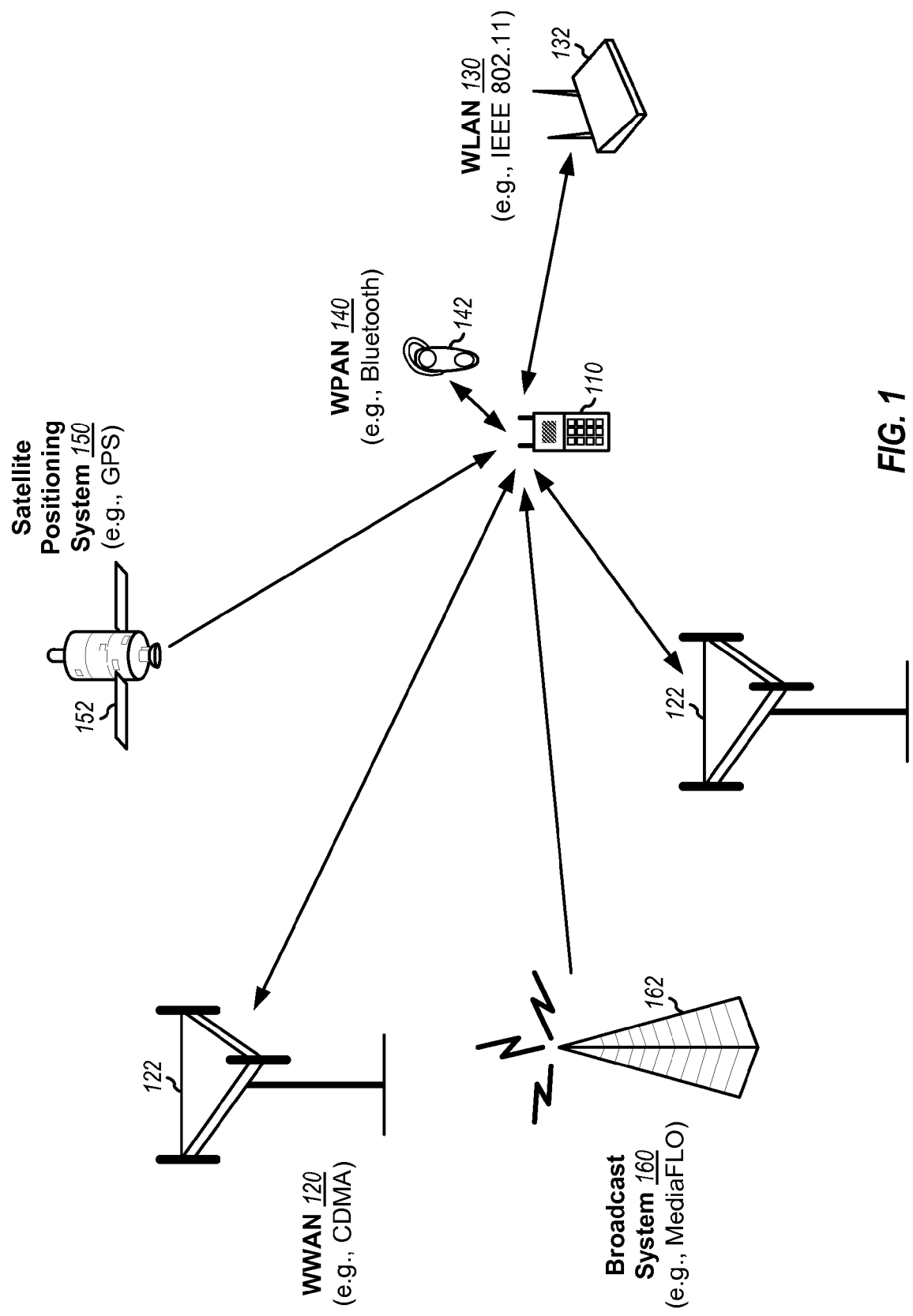
FIG. 1 shows a wireless communication device supporting different systems.

FIG. 1 shows a wireless communication device 110 capable of communicating with different wireless communication systems and networks. The terms "system" and "network" are often used interchangeably. In the example shown in FIG. 1, wireless device 110 may be capable of communicating with a wireless wide area network (WWAN) 120, a wireless local area network (WLAN) 130, a wireless personal area network (WPAN) 140, a satellite positioning system (SPS) 150, and a broadcast system 160. In general, wireless device 110 may be capable of communicating with any number, any type, and any combination of one or more systems and networks.

WWAN 120 provides communication coverage for a large geographic area such as, e.g., a city, a state, or an entire country. WWAN 120 may be a Code Division Multiple Access (CDMA) network, a Time Division Multiple Access (TDMA) network, a Frequency Division Multiple Access (FDMA) network, an Orthogonal Frequency Division Multiple Access (OFDMA) network, a Single-Carrier FDMA (SC-FDMA) network, etc. A CDMA network may implement a radio technology such as cdma2000, Universal Terrestrial Radio Access (UTRA), etc. cdma2000 covers IS-2000, IS-95 and IS-856 standards. UTRA includes Wideband-CDMA (W-CDMA) and other variants of CDMA. A TDMA network may implement a radio technology such as Global System for Mobile Communications (GSM), Digital Advanced Mobile Phone System (D-AMPS), etc. An OFDMA system may implement a radio technology such as Evolved UTRA (E-UTRA), Ultra Mobile Broadband (UMB), IEEE 802.16 (WiMAX), IEEE 802.20, Flash-OFDM®, etc. UTRA and E-UTRA are part of Universal Mobile Telecommunication System (UMTS). 3GPP Long Term Evolution (LTE) is an upcoming release of UMTS that uses E-UTRA. These various networks, radio technologies, and standards are known in the art.

WLAN 130 provides communication coverage for a medium geographic area such as, e.g., a building, a home, etc. WLAN 130 may implement a radio technology such as any in the IEEE 802.11 family of standards, Hiperlan, etc. WPAN 140 provides communication coverage for a small geographic area. WPAN 140 may implement Bluetooth, which is a short-range radio technology adopted as IEEE 802.15 standard.

Satellite positioning system 150 may be the United States Global Positioning System (GPS), the Russian GLONASS system, the European Galileo system, or some other satellite positioning system. GPS is a constellation of 24 well-spaced satellites plus some spare satellites that orbit the earth. Each GPS satellite transmits an encoded signal that allows receivers on earth to accurately estimate their positions based on measurements for a sufficient number of satellites (typically four) and the known locations of these satellites. Broadcast system 160 may be a MediaFLO system, a Digital Video Broadcasting for Handhelds (DVB-H) system, an Integrated Services Digital Broadcasting for Terrestrial Television Broadcasting (ISDB-T) system, a Digital Multimedia Broadcasting (DMB) system, or some other broadcast system.

Wireless device 110 may be stationary or mobile and may also be referred to as a mobile station, a user equipment, a terminal, a station, a subscriber unit, etc. Wireless device 110 may be a cellular phone, a personal digital assistant (PDA), a wireless modem, a handheld device, a laptop computer, a cordless phone, etc. As shown in FIG. 1, wireless device 110 may communicate two-way with base stations 122 in WWAN 120, an access point 132 in WLAN 130, and/or a headset 142 in WPAN 140 at any given moment. Wireless device 110 may also receive signals from satellites 152 in SPS 150 and/or a broadcast station 162 in broadcast system 160 at any given moment. Wireless device 110 may process a received signal and/or generate a transmit signal for each system based on the radio technology used by that system.

Figure 2:
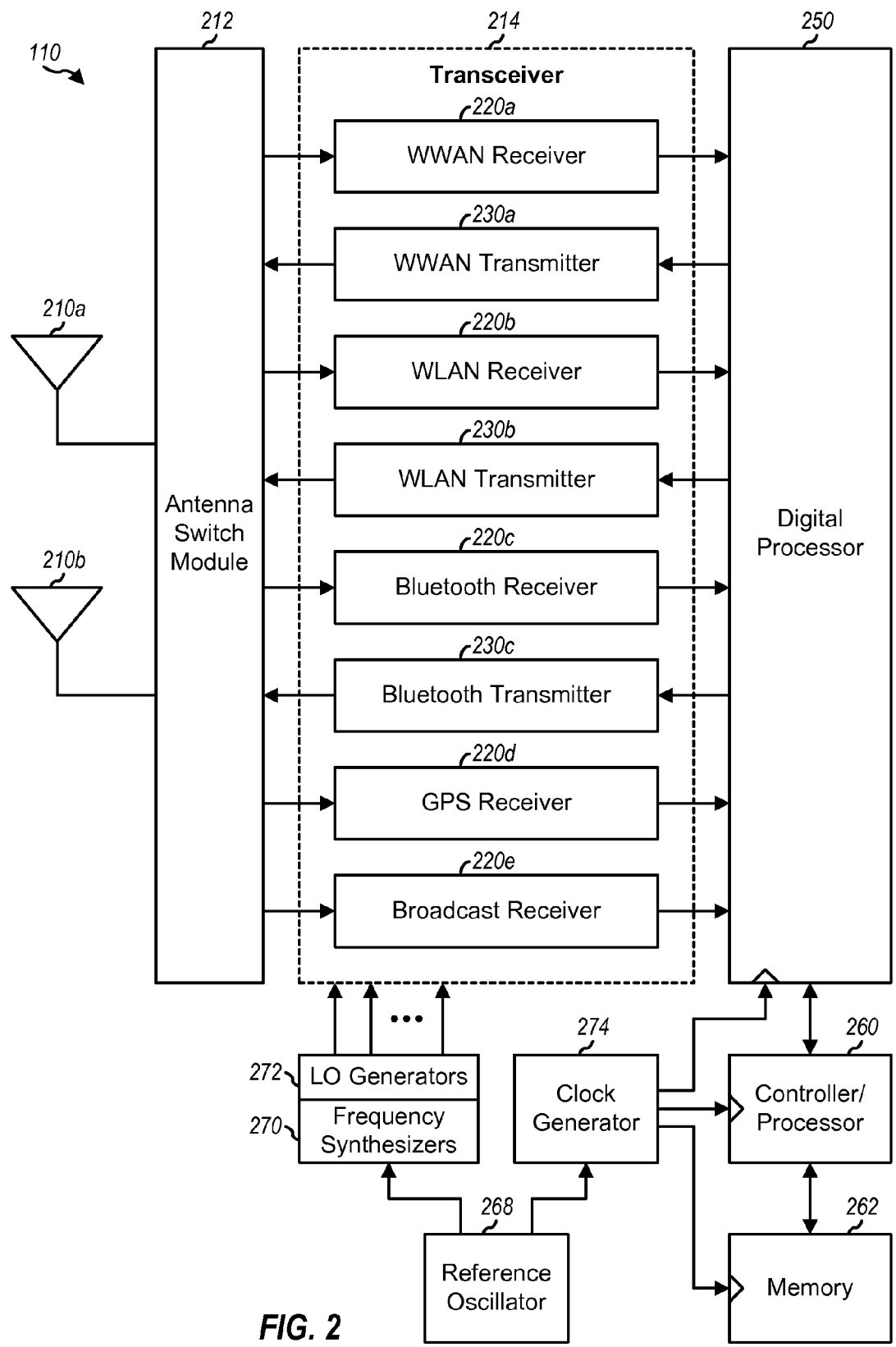
FIG. 2 shows a block diagram of the wireless device.

FIG. 2 shows a block diagram of a design of wireless device 110. In this design, wireless device 110 includes a transceiver 214 having a receiver 220a and a transmitter 230a for WWAN 120, a receiver 220b and a transmitter 230b for WLAN 130, a receiver 220c and a transmitter 230c for WPAN 140, a receiver 220d for SPS 150, and a receiver 220e for broadcast system 160. Each receiver 220 may process a received signal for an associated system and provide an input baseband signal to a digital processor 250. Each transmitter 230 may receive an output baseband signal from digital processor 250 and generate a transmit signal for an associated system. An antenna switch module 212 couples receivers 220a through 220e and transmitters 230a through 230c to antennas 210a and 210b. Module 212 may include one or more switches, duplexers, diplexers, etc., to route the received signals from antennas 210 to receivers 220 and to route the transmit signals from transmitters 230 to antennas 210. In general, wireless device 110 may include any number of antennas, any number of receivers, and any number of transmitters for any number of systems and frequency bands.

Digital processor 250 may include various processing units for data transmission and reception and for other functions. For example, digital processor 250 may include one or more digital signal processors (DSPs), reduced instruction set computer (RISC) processors, central processing units (CPUs), etc. A controller/processor 260 may control the operation at wireless device 110. A memory 262 may store program codes and data for wireless device 110. Data processor 250, controller/processor 260, and/or memory 262 may be implemented on one or more application specific integrated circuits (ASICs) and/or other ICs.

A reference oscillator 268 generates a reference signal having a frequency of $f_{ref}$, which is relatively precise. Oscillator 268 may be a crystal oscillator (XO), a voltage controlled crystal oscillator (VCXO), a temperature-compensated crystal oscillator (TCXO), a voltage-controlled TCXO (VC-TCXO), or some other type of oscillator. Frequency synthesizers 270 receive the reference signal and generate oscillator signals. LO generators 272 receive the oscillator signals from frequency synthesizers 270 and generate LO signals for receivers 220 and transmitters 230. Frequency synthesizers 270 may include any number of PLLs to generate any number of oscillator signals. A clock generator 274 also receives the reference signal and generates clocks for digital processor 250, controller/processor 260, and memory 262. All or part of receivers 220a through 220e, transmitters 230a through 230c, oscillator 268, frequency synthesizers 270, and/or LO generators 272 may be implemented on one or more radio frequency integrated circuits (RFICs), mixed-signal ICs, ASICs, etc.

In general, a transmitter or a receiver may be implemented with a super-heterodyne architecture or a direct-conversion architecture. In the super-heterodyne architecture, a signal is frequency converted between radio frequency (RF) and baseband in multiple stages, e.g., from RF to an intermediate frequency (IF) in one stage, and then from IF to baseband in another stage for a receiver. In the direct-conversion architecture, which is also referred to as a zero-IF (ZIF) architecture, a signal is frequency converted between RF and baseband in one stage. The super-heterodyne and direct-conversion architectures may use different circuit blocks and/or have different requirements.

Each system may operate on one or more frequency channels in one or more frequency bands. A frequency channel may also be referred to as a CDMA channel, an RF channel, etc. For cdma2000, each frequency channel has a bandwidth of 1.23 MHz and a center frequency located at 30 KHz raster or increment. For W-CDMA, each frequency channel has a bandwidth of 3.84 MHz and a center frequency located at 200 KHz raster. For GSM, each frequency channel has a bandwidth of 200 KHz and a center frequency located at 200 KHz raster. The center frequency and bandwidth of each frequency channel may be dependent on the system.

Figure 3:
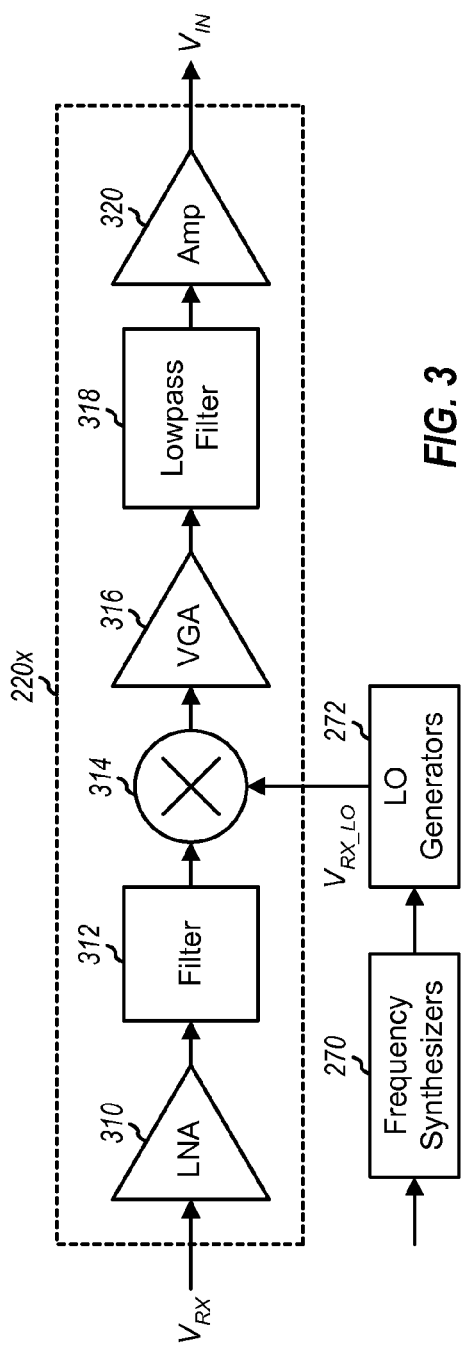
FIG. 3 shows a block diagram of a direct-conversion receiver.

FIG. 3 shows a block diagram of a design of a direct-conversion receiver 220x, which may be used for any one of receivers 220a through 220e in FIG. 2. Within receiver 220x, a low noise amplifier (LNA) 310 amplifies a received signal $V_{RX}$ from antenna switch module 212 and provides an amplified signal. A filter 312 filters the amplified signal to pass signal components in a frequency band of interest and to remove out-of-band noise and undesired signals. A mixer 314 frequency downconverts the filtered signal with an LO signal $V_{RX\_LO}$ from LO generators 272 and provides a downconverted signal. The frequency of the LO signal, $f_{RX\_LO}$, is selected such that a desired signal in a selected frequency channel is downconverted to baseband or near-baseband.

A variable gain amplifier (VGA) 316 amplifies the downconverted signal with a variable gain and provides a signal having a desired signal level. A lowpass filter 318 filters the signal from VGA 316 to pass the desired signal in the selected frequency channel and to remove noise and undesired signals that may be generated by the downconversion process. An amplifier (Amp) 320 amplifies and buffers the signal from filter 318 and provides an input baseband signal $V_{IN}$ to digital processor 250.

Figure 4:
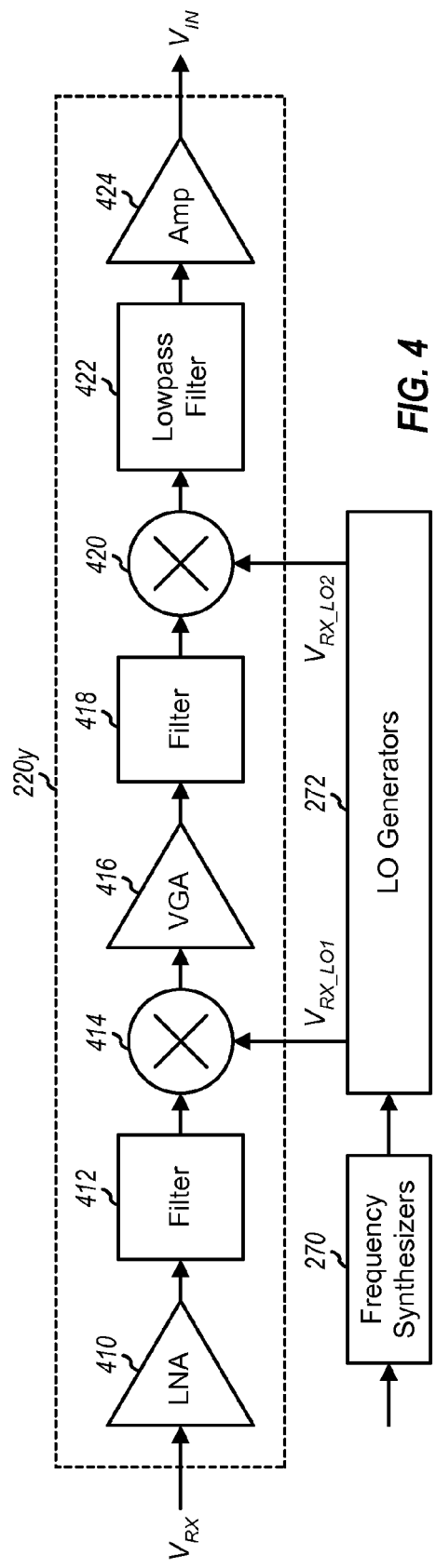
FIG. 4 shows a block diagram of a super-heterodyne receiver.

FIG. 4 shows a block diagram of a design of a super-heterodyne receiver 220y, which may also be used for any one of receivers 220a through 220e in FIG. 2. Within receiver 220y, a received signal $V_{RX}$ is amplified by an LNA 410, filtered by a filter 412, and downconverted from RF to IF by a mixer 414 with a first LO signal $V_{RX\_LO1}$ from LO generators 272. The frequency of the first LO signal, $f_{RX\_LO1}$, may be selected such that a desired signal in a selected frequency channel is downconverted to a specific IF frequency.

The IF signal from mixer 414 is amplified by a VGA 416, filtered by a filter 418, and downconverted from IF to baseband or near baseband by a mixer 420 with a second LO signal $V_{RX\_LO2}$ from LO generators 272. The frequency of the second LO signal, $f_{RX\_LO2}$, is dependent on the IF frequency. The downconverted signal from mixer 420 is filtered by a filter 422 and amplified by an amplifier 424 to obtain an input baseband signal $V_{IN}$, which is provided to digital processor 250.

Figure 5:
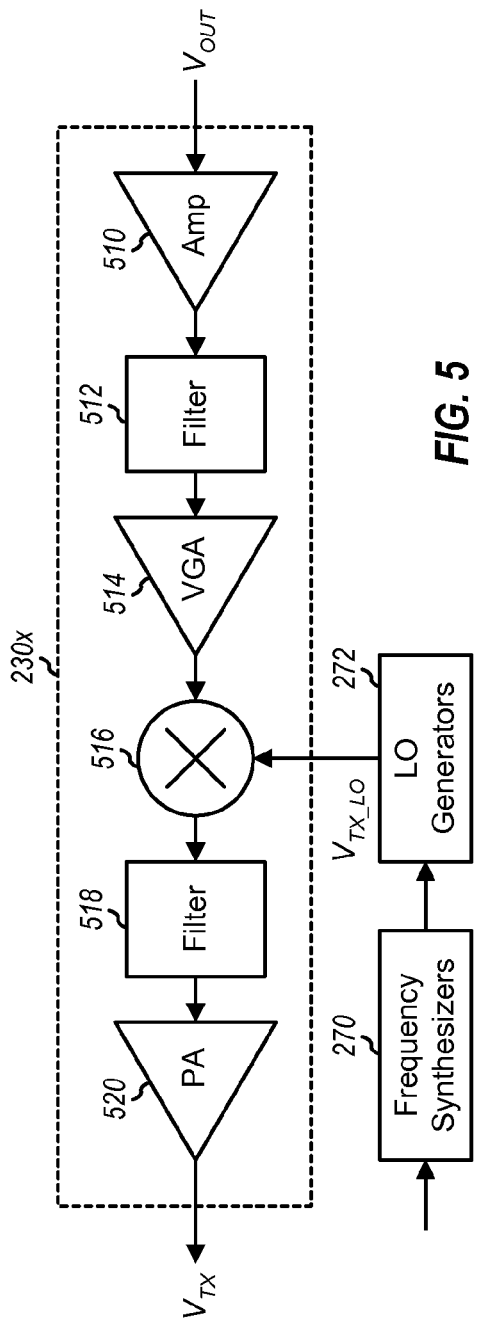
FIG. 5 shows a block diagram of a direct-conversion transmitter.

FIG. 5 shows a block diagram of a design of a direct-conversion transmitter 230x, which may be used for any one of transmitters 230a through 230c in FIG. 2. Within transmitter 230x, an output baseband signal $V_{OUT}$ is amplified by an amplifier 510, filtered by a lowpass filter 512 to remove images caused by digital-to-analog conversion, amplified by a VGA 514, and upconverted from baseband to RF by a mixer 516 with an LO signal $V_{TX\_LO}$ from LO generators 272. The upconverted signal is filtered by a bandpass filter 518 to remove images caused by the frequency upconversion and further amplified by a power amplifier (PA) 520 to generate a transmit signal $V_{TX}$.

Figure 6:
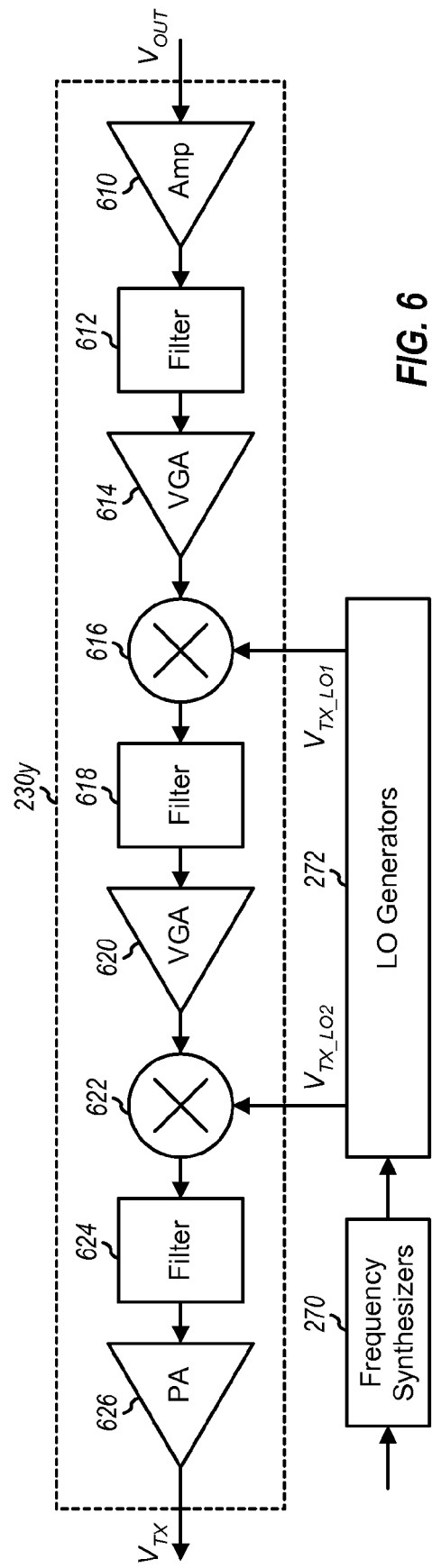
FIG. 6 shows a block diagram of a super-heterodyne transmitter.

FIG. 6 shows a block diagram of a design of a super-heterodyne transmitter 230y, which may also be used for any one of transmitters 230a through 230c in FIG. 2. Within transmitter 230y, an output baseband signal $V_{OUT}$ is amplified by an amplifier 610, filtered by a lowpass filter 612, amplified by a VGA 614, and upconverted from baseband to IF by a mixer 616 with a first LO signal $V_{TX\_LO1}$ from LO generators 272. The IF signal is filtered by a filter 618, amplified by a VGA 620, and upconverted from IF to RF by a mixer 622 with a second LO signal $V_{TX\_LO2}$ from LO generators 272. The upconverted signal is filtered by a bandpass filter 624 and further amplified by a power amplifier 626 to generate a transmit signal $V_{TX}$.

FIGS. 3 through 6 show some example transmitter and receiver designs. In general, the conditioning of the signals in a transmitter or a receiver may be performed by one or more stages of amplifier, filter, mixer, etc. These circuit blocks may be arranged differently from the configurations shown in FIGS. 3 through 6. Furthermore, other circuit blocks not shown in FIGS. 3 through 6 may be used to condition the signals in the transmitter and receiver. Some circuit blocks in FIGS. 3 through 6 may also be omitted. For example, filters 312 and 412 in FIGS. 3 and 4 may be omitted, and the output of the LNAs may be coupled directly to the mixers.

Figure 7:
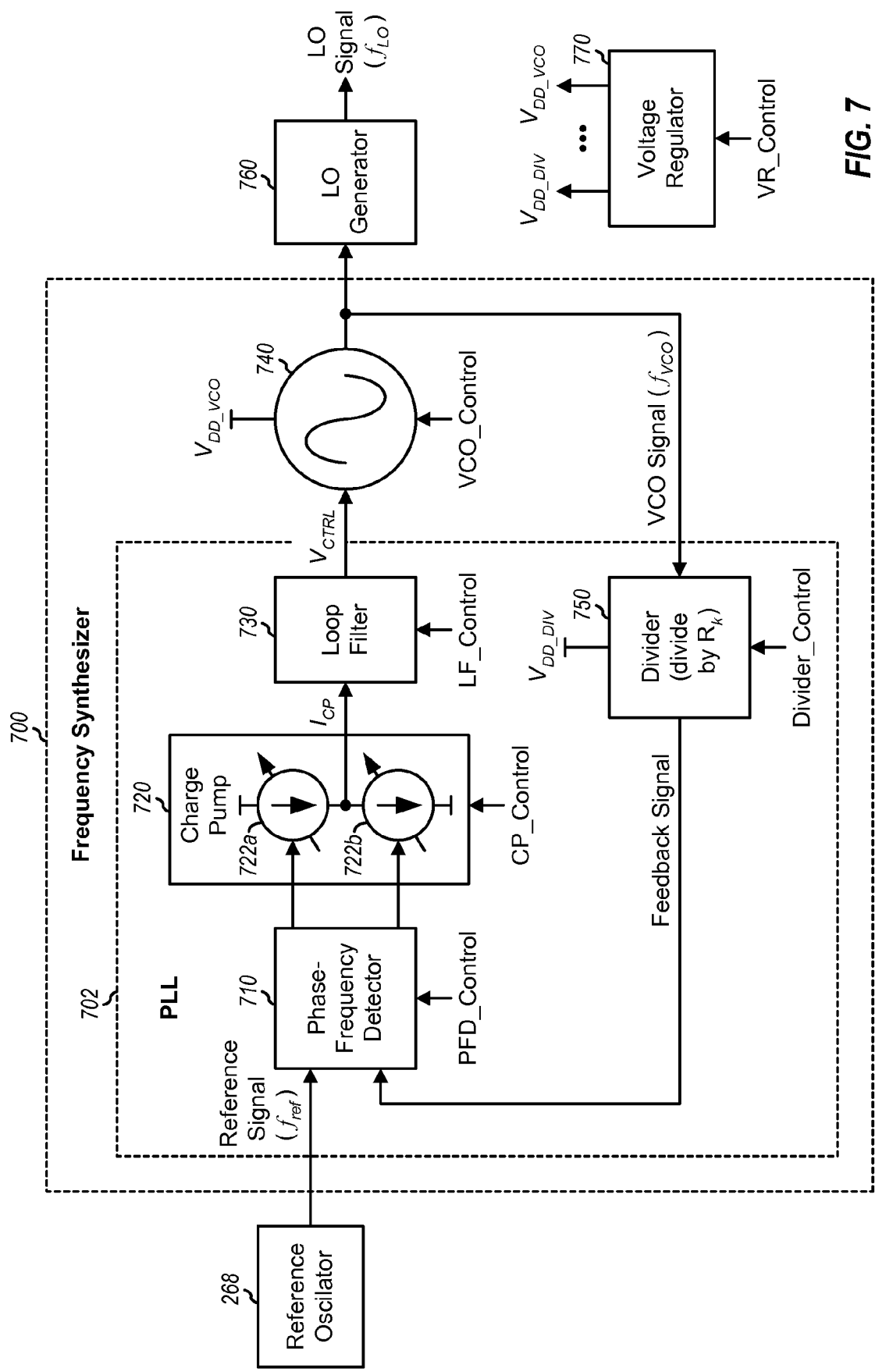
FIG. 7 shows a block diagram of a PLL in a frequency synthesizer.

FIG. 7 shows a block diagram of a design of a frequency synthesizer 700, which may be used for frequency synthesizers 270 in FIG. 2. Frequency synthesizer 700 includes a PLL 702 and a VCO 740. VCO 740 generates a VCO signal having a frequency of $f_{VCO}$, which is determined by a control signal $V_{CTRL}$ from a loop filter 730 in PLL 702.

Within PLL 702, a divider 750 divides the VCO signal in frequency by a factor of $R_k$ and provides a feedback signal. In general, $R_k$ may be an integer or non-integer value and may be determined as described below. A phase-frequency detector (PFD) 710 receives the reference signal from oscillator 268 and the feedback signal from divider 750. Detector 710 compares the phases of the two signals and provides a detector signal that indicates the phase difference/error between the two signals. A charge pump 720 generates an error signal $I_{CP}$ that is proportional to the detected phase error. Loop filter 730 filters the error signal and provides the control signal for VCO 740. Loop filter 730 adjusts the control signal such that the phase and frequency of the feedback signal is locked to the phase and frequency of the reference signal. Loop filter 730 has a frequency response that may be selected to achieve the desired closed-loop response for PLL 702. For example, the frequency response of loop filter 730 may be selected based on a tradeoff between acquisition and tracking performance and noise performance.

An LO generator 760 may be used for LO generators 272 in FIG. 2. LO generator 760 may receive the VCO signal from VCO 740 and provide an LO signal having a frequency of $f_{LO}$. LO generator 760 may include a buffer, a divider, a quadrature splitter, etc. In one design, VCO 740 operates at the LO frequency, so that $f_{VCO}=f_{LO}$. In another design, VCO 740 operates at S times the LO frequency, so that $f_{VCO}=S \cdot f_{LO}$, and the VCO signal may be divided in frequency by an integer factor of S to obtain the LO signal.

A voltage regulator 770 may generate a supply voltage $V_{DD\_VCO}$ for VCO 740, a supply voltage $V_{DD\_DIV}$ for divider 750, and possibly other supply voltages for other blocks within frequency synthesizer 700. In general, voltage regulator 770 may generate any number of supply voltages for any number of blocks within frequency synthesizer 700.

FIG. 7 shows an example design of PLL 702 and frequency synthesizer 700. PLL 702 and frequency synthesizer 700 may also include different and/or additional blocks. Each block within PLL 702 may be implemented with digital circuits, analog circuits, or a combination of both.

In the design shown in FIG. 7, various blocks within PLL 702 or frequency synthesizer 700 may be controlled based on respective controls to achieve good performance. A PFD_Control may adjust the gain of phase frequency detector 710. A CP_Control may adjust the amount of current via current sources 722a and 722b within charge pump 720, which would vary the gain of the charge pump. An LF_Control may adjust the values of circuit components (e.g., capacitors) within loop filter 730. A VCO_Control may adjust the values of circuit components (e.g., capacitors) within VCO 740 to achieve the desired frequency of oscillation. A Divider_Control may select a suitable overall divider ratio $R_k$ and determine the configuration of divider 750, as described below. A VR_Control may set the supply voltages for VCO 740, divider 750, etc. In general, a frequency synthesizer may include one or more controls for one or more blocks within the frequency synthesizer. A frequency synthesizer may include all or a subset of the controls shown in FIG. 7 and may also include other controls not shown in FIG. 7.

FIG. 7 shows frequency synthesizer 700 and LO generator 760 for generating one VCO signal and one LO signal, respectively. Multiple frequency synthesizers and multiple LO generators 760 may be used to generate multiple VCO signals and multiple LO signals at the same time. For example, two frequency synthesizers 700 may be used to generate two VCO signals, and two LO generators may be used to generate two LO signals at frequencies of $f_{RX\_LO1}$ and $f_{RX\_LO2}$ for super-heterodyne receiver 220y in FIG. 4. LO frequency $f_{RX\_LO1}$ may be variable and dependent on the selected frequency channel whereas LO frequency $f_{RX\_LO2}$ may be at a fixed IF frequency. In general, any number of frequency synthesizers 700 and any number of LO generators 760 may be used to generate any number of VCO signals and any number of LO signals, which may be for any number of receivers and transmitters.

Frequency synthesizer 700 may support multiple frequency channels for one or more systems and one or more frequency bands. Each frequency channel has a specific center frequency. Frequency synthesizer 700 may be controlled to generate the proper VCO signal, which may be used by LO generator 760 to generate the LO signal at the proper frequency and with the desired characteristics for the selected frequency channel. For example, the desired VCO frequency $f_{VCO}$ may be obtained by choosing the proper overall divider ratio $R_k$ for divider 750. The desired VCO signal characteristics may be obtained by controlling the gain of phase frequency detector 710, the amount of current in charge pump 720, the component values of loop filter 730, the configuration of divider 750, and/or the supply voltages for VCO 740, divider 750, etc.

The analog and digital circuits in wireless device 110 may be implemented in close proximity to one another. For example, the analog and digital circuits may be implemented on the same printed circuit board or the same IC die. As IC fabrication technology improves, it may be possible to design high-frequency (e.g., GHz) analog circuits with complementary metal oxide semiconductor (CMOS) technology, which has been used primarily for digital circuits. This may then allow for integration of the analog and digital circuits on the same IC die. However, the digital circuits typically generate lots of spurs, which may couple to the analog circuits via substrate and/or other mechanisms. The spurs may adversely impact the performance of the analog circuits and make it difficult to integrate the analog circuits with the digital circuits.

Spurs may be generated within wireless device 110 in various manners. Spurs may be generated by clocks within wireless device 110 and may appear at harmonics of these clocks. For example, clocks may be generated based on the reference signal from oscillator 268, and spurs at harmonics of $f_{ref}$ may be prevalent within wireless device 110. Higher-frequency clocks (e.g., in the hundreds of MHz) may be generated by clock generator 274 and provided to digital processor 250 and other digital circuits. Spurs may then be present at harmonics of the higher-frequency clocks. Spurs may also be generated by the mixing of clock harmonics and VCO frequencies. For example, spurs may be generated at frequencies of $f_{VCO} \pm n \cdot f_{ref}$, where n is the n-th harmonic of the reference signal. If the LO frequency is obtained by dividing the VCO frequency by a factor of S, then spurs may be generated at frequencies of $f_{VCO}/S \pm n \cdot f_{ref}$. Wireless device 110 may thus have fixed spurs at specific frequencies (e.g., at clock harmonics) as well as channel-dependent spurs at frequencies determined based on the VCO frequency $f_{VCO}$ and the configuration of the PLL for the selected frequency channel.

Frequency programming refers to the programming of various blocks within a PLL or a frequency synthesizer to obtain the desired frequency and characteristics for a VCO signal. The PLL may support multiple frequency channels and may be programmed in similar manner for all supported frequency channels. For example, all frequency channels may have the same settings for all blocks within the PLL except for the overall divider ratio $R_k$ in divider 750. In this case, some of the supported frequency channels may observe excessive degradation due to spurs while other frequency channels may not experience spur problems.

In an aspect, non-uniform frequency programming may be used to avoid spurs or to reduce spur levels for the frequency channels supported by wireless device 110. With non-uniform frequency programming, different settings may be used for the blocks within a PLL or a frequency synthesizer for different frequency channels. A suitable set of PLL settings may be selected for each frequency channel such that the adverse effects due to spurs can be mitigated and good performance can be achieved for the frequency channel. Non-uniform frequency programming may be supported with one or more of the following:

Use of different PLL loop bandwidths,
Use of different frequency equations,
Use of different frequency division schemes,
Use of high side or low side injection for super-heterodyne architecture, and
Use of different supply voltages for blocks within the frequency synthesizer.

In an aspect, the PLL loop bandwidth may be adjusted based on the frequency location of the spurs. The PLL may be designed to have a nominal loop bandwidth (e.g., tens of KHz), which may be selected based on a tradeoff between acquisition and tracking performance and noise performance. If spurs are located outside of the loop bandwidth, then the loop bandwidth may be reduced to achieve more rejection of the spurs. A smaller loop bandwidth may be obtained by decreasing the gain of phase frequency detector 710, decreasing the amount of current from charge pump 720, selecting a larger capacitor value for loop filter 730, etc. Conversely, if spurs located within the loop bandwidth are due to direct coupling of spurs to the VCO, then the loop bandwidth may be increased to reduce the inband gain from the VCO, which may then reduce the spur levels. A larger loop bandwidth may be obtained by increasing the gain of phase frequency detector 710, increasing the amount of current from charge pump 720, selecting a smaller capacitor value for loop filter 730, etc. A suitable loop bandwidth may be selected for each frequency channel based on the spurs observed for that frequency channel. The loop bandwidth selection may be based on computer simulation, empirical measurement, field testing, etc.

Figure 8:
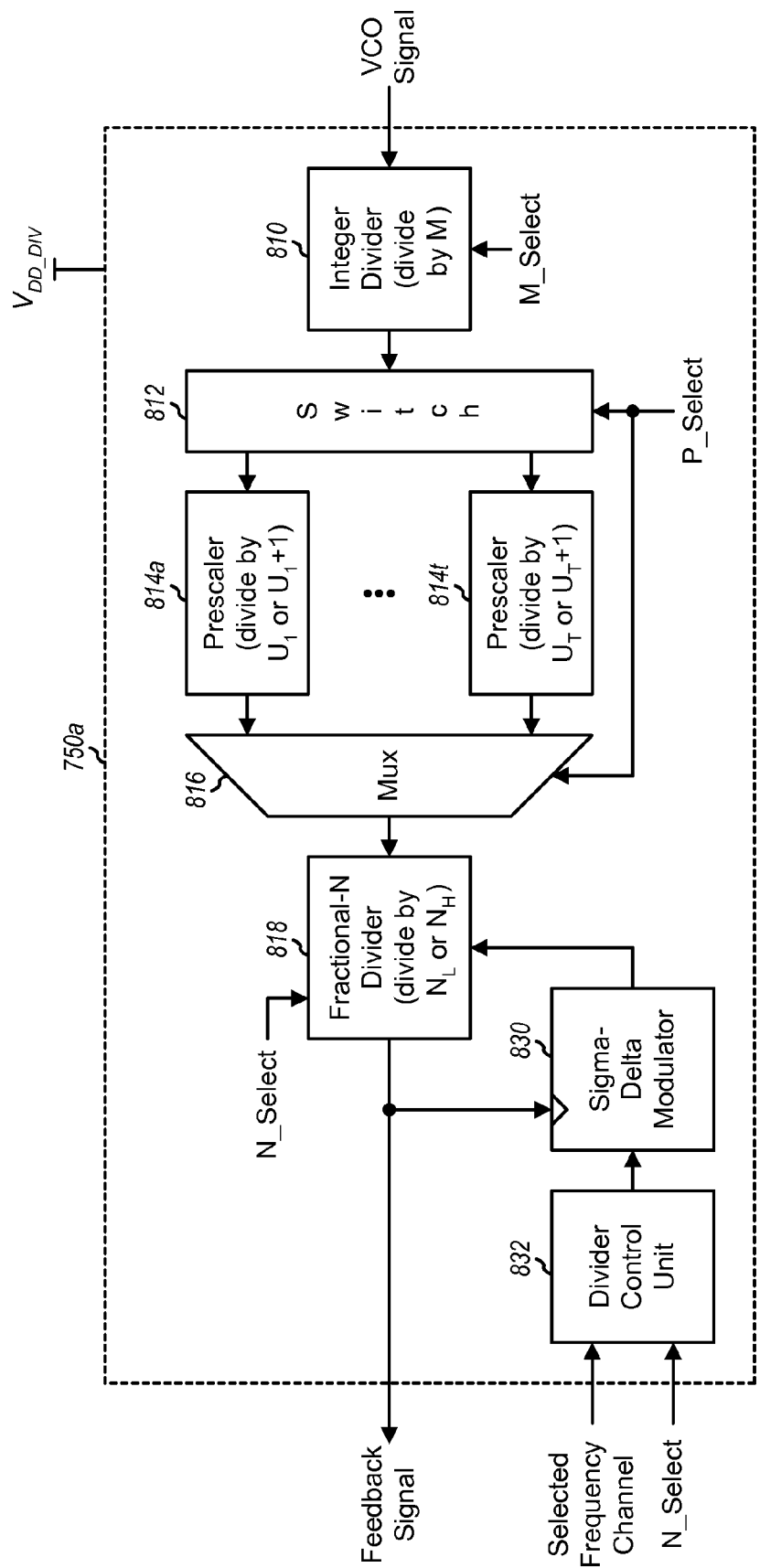
FIG. 8 shows a block diagram of a design of a divider within the PLL.

FIG. 8 shows a block diagram of a divider 750a, which is a design of divider 750 within PLL 702 in FIG. 7. Within divider 750a, an integer divider 810 divides the VCO signal in frequency by an integer factor of $M_k$, which may be equal to 1, 2, 3, 4, etc. Divider ratio $M_k$ may be configurable for frequency channel k and may be selected by an M_Select signal. A switch 812 routes the output of divider 810 to one of T prescalers 814a through 814t based on a P_Select signal, where T may be any integer value. Each prescaler 814 may divide the signal from divider 810 in frequency by a factor of either U or U+1 at any given moment, where U may be different for different prescalers. For example, prescaler 814a may divide by either 8 or 9 (for $U_1=8$), and so on, and prescaler 814t may divide by either 4 or 5 (for $U_T=4$). A multiplexer (Mux) 816 routes a prescaled signal from the selected prescaler 814 to a fractional-N divider 818. The prescaled signal has a frequency of $f_{PRE}$, which may be expressed as:

$$f_{PRE} = \frac{f_{VCO}}{M_k \cdot P_k}, \quad \text{Eq (1)}$$

where $f_{VCO}$ is the frequency of the VCO signal, and
$P_k$ is the prescaler ratio for the prescaler selected for frequency channel k.

The VCO signal may be used by LO generator 760 to generate the LO signal at the LO frequency. The LO frequency $f_{LO}$ is dependent on the center frequency of frequency channel k and may correspond to $f_{RX\_LO}$ for LO signal $V_{RX\_LO}$ in FIG. 3, $f_{RX\_LO1}$ for LO signal $V_{RX\_LO1}$ in FIG. 4, $f_{TX\_LO}$ for LO signal $V_{TX\_LO}$ in FIG. 5, or $f_{TX\_LO2}$ for LO signal $V_{TX\_LO2}$ in FIG. 6.

The prescaler ratio $P_k$ is dependent on the divider ratios $U_k$ and $U_k+1$ of the selected prescaler as well as the percentage of time that each divider ratio is used. For example, if the selected prescaler for frequency channel k divides by $U_k+1$ for V out of W cycles and divides by $U_k$ for the remaining W−V cycles, then the prescaler ratio may be given as $P_k=U_k+V/W$. V and W may be fixed values or may be dependent on frequency channel k.

Divider 818 divides the prescaled signal from multiplexer 816 in frequency by an integer factor of either $N_L$ or $N_H$ based on a divider select signal from a sigma-delta modulator 830. Divider 818 may divide by $N_L$ some of the time and by $N_H$ the remaining time to obtain the desired frequency for the feedback signal.

In one design, a divider control unit 832 receives the selected frequency channel and determines a divider ratio $N_k$ for divider 818, which may be expressed as:

$$N_k = \frac{f_{PRE}}{f_{ref}}. \quad \text{Eq (2)}$$

The divider ratio $N_k$ for frequency channel k ranges between integer values of $N_L$ and $N_H$, or $N_L \leq N_k \leq N_H$. The divider ratio $N_k$ may be expressed based on $N_L$ and $N_H$ as follows:

$$N_k = (1 - \text{Frac}_k) \cdot N_L + \text{Frac}_k \cdot N_H, \quad \text{Eq (3)}$$

where $\text{Frac}_k$ is the percentage of time to use $N_H$, and $(1-\text{Frac}_k)$ is the percentage of time to use $N_L$. $\text{Frac}_k$ may be determined as follows:

$$\text{Frac}_k = \left(\frac{N_k - N_L}{N_H - N_L}\right). \quad \text{Eq (4)}$$

For example, if $N_k=N_H$, then $\text{Frac}_k=1$, $N_H$ is used all the time, and $N_L$ is not used.

Divider control unit 832 may receive an N_Select signal that indicates the values of $N_L$ and $N_H$ for frequency channel k. Unit 832 may determine $\text{Frac}_k$ as shown in equation (4) and then quantize $\text{Frac}_k$ to L bits. L may be selected to achieve the desired frequency resolution and may be equal to 10, 16, 23, etc. Unit 832 provides the L-bit $\text{Frac}_k$ to sigma-delta modulator 830.

Sigma-delta modulator 830 receives the L-bit $\text{Frac}_k$ and generates the divider select signal for divider 818. In one design, the divider select signal is a 1-bit control that instructs divider 818 to divide by either $N_L$ or $N_H$. For example, a logic low ('0') on the divider select signal may correspond to divide by $N_L$, and a logic high ('1') on the divider select signal may correspond to divide by $N_H$. The percentage of ones on the divider select signal is determined by $Frac_k$. However, the ones are distributed on the divider select signal in a manner such that quantization noise is shifted to higher frequencies and good phase noise characteristic is achieved for the VCO signal from VCO 740. FIG. 8 shows the use of sigma-delta modulator 830 to select between $N_L$ and $N_H$ for divider 818. The selection of $N_L$ or $N_H$ for divider 818 may also be made in other manners.

Figure 9:
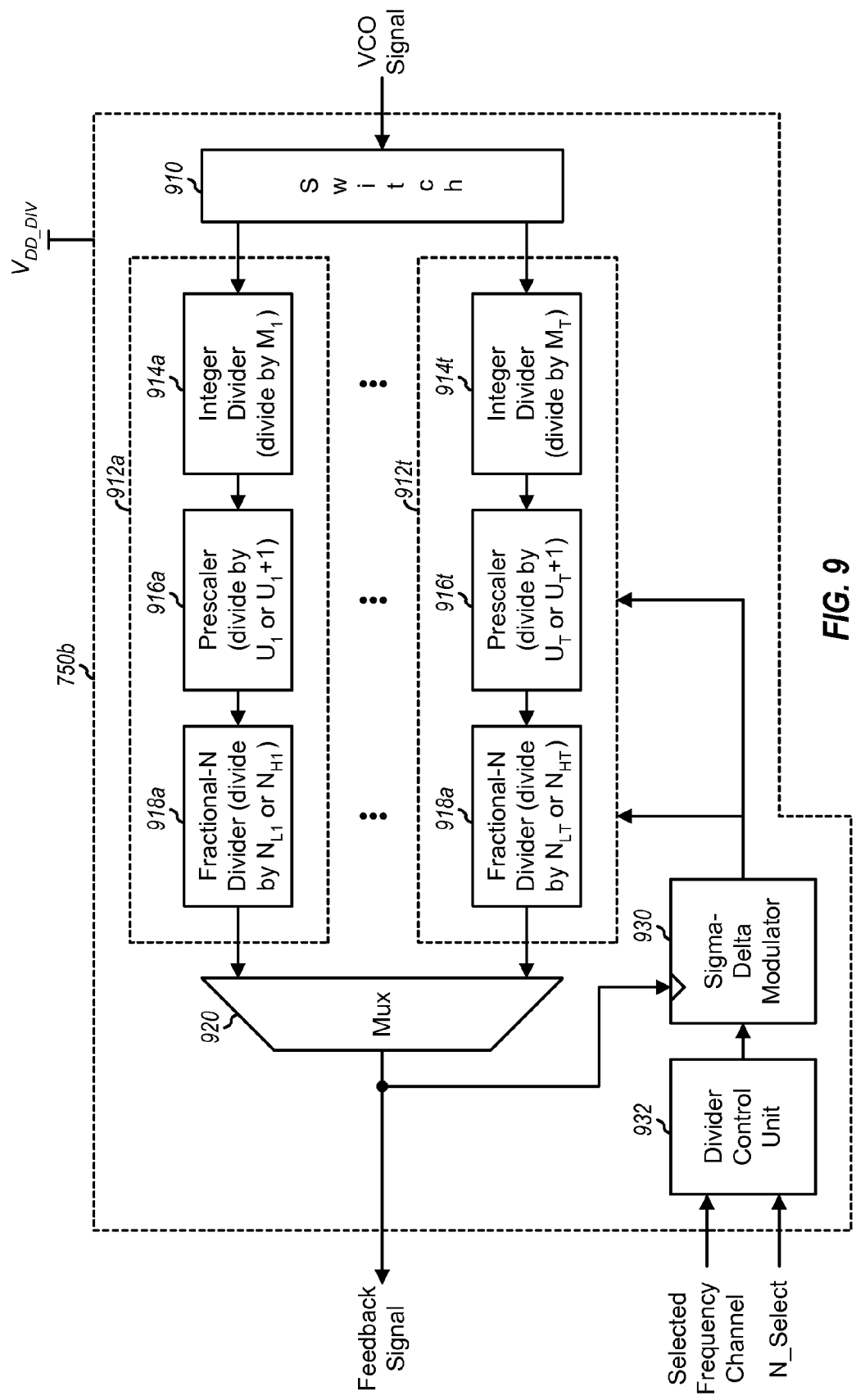
FIG. 9 shows a block diagram of another design of the divider within the PLL.

FIG. 9 shows a block diagram of a divider 750*b*, which is another design of divider 750 within PLL 702 in FIG. 7. Within divider 750*b*, a switch 910 routes the VCO signal to one of T divider chains 912*a* through 912*t*. Each divider chain 912 includes an integer divider 914 that divides by an integer value of M, a prescaler 916 that divides by either U or U+1, and a fractional-N divider 918 that divides by either $N_L$ or $N_H$. A multiplexer 920 provides a signal from the selected divider chain 912 as the feedback signal.

In one design, the prescaler ratio $P_k$ and the divider ratio $N_k$ for frequency channel k may be jointly determined, as follows:

$$Z_k = N_k \cdot P_k = \frac{f_{VCO}}{M_k \cdot f_{ref}}, \quad \text{Eq (5)}$$

where $Z_k$ is a combined divider ratio for both prescaler 916 and fractional-N divider 918 in the selected divider chain 912 for frequency channel k. $Z_k$ may range between integer values of $Z_L$ and $Z_H$, or $Z_L \leq Z_k \leq Z_H$. $Z_L$ may be defined as $Z_L = N_L + U_k$, and $Z_H$ may be defined as $Z_H = N_H + U_k + 1$. $Z_L$ and $Z_H$ may also be defined in other manners.

The combined divider ratio $Z_k$ may be expressed based on $Z_L$ and $Z_H$ as follows:

$$Z_k = (1 - Frac_k) \cdot Z_L + Frac_k \cdot Z_H, \quad \text{Eq (6)}$$

where $Frac_k$ is the percentage of time to use $Z_H$, and $(1 - Frac_k)$ is the percentage of time to use $Z_L$. $Frac_k$ may be determined as follows:

$$Frac_k = \left(\frac{Z_k - Z_L}{Z_H - Z_L}\right). \quad \text{Eq (7)}$$

A divider control unit 932 may receive the frequency channel and the N_Select signal for frequency channel k. Unit 932 may determine $Frac_k$ as shown in equation (7) and then quantize $Frac_k$ to L bits. A sigma-delta modulator 930 may receive the L-bit $Frac_k$ from unit 930 and generate the divider select signal for both prescaler 916 and divider 918 in the selected divider chain 912.

FIGS. 8 and 9 show two example designs of divider 750. In general, divider 750 may be implemented with various designs having a fixed or configurable integer divider, a fixed or configurable prescaler, and a fixed or configurable fractional-N divider. The integer divider, prescaler, and fractional-N divider for each frequency channel may be controlled together or separately.

In another aspect, multiple frequency equations may be defined for each supported frequency channel. Combining equations (1) through (3), a frequency equation may be expressed as:

$$f_{VCO} = M_k \cdot P_k \cdot [(1 - Frac_k) \cdot N_L + Frac_k \cdot N_H] \cdot f_{ref} \quad \text{Eq (8)}$$

Similarly, combining equations (5) and (6), a frequency equation may be expressed as:

$$f_{VCO} = M_k \cdot [(1 - Frac_k) \cdot Z_L + Frac_k \cdot Z_H] \cdot f_{ref} \quad \text{Eq (9)}$$

Multiple frequency equations may be defined for each frequency channel with different sets of values for $N_L$ and $N_H$ in equation (8) or different sets of values for $Z_L$ and $Z_H$ in equation (9). In one design, if $N = \lfloor N_k \rfloor$ where "$\lfloor \; \rfloor$" is a floor operator, then a first frequency equation may be defined with $N_L = N$ and $N_H = N+1$, a second frequency equation may be defined with $N_L = N$ and $N_H = N+2$, a third frequency equation may be defined with $N_L = N-1$ and $N_H = N+1$, a fourth frequency equation may be defined with $N_L = N-1$ and $N_H = N+2$, etc. As an example, if $N_k = 8.7$ for the design in FIG. 8, then $N = 8$ and a first frequency equation may be defined with divider 818 dividing by either 8 or 9, a second frequency equation may be defined with divider 818 dividing by either 8 or 10, a third frequency equation may be defined with divider 818 dividing by either 7 or 10, and a fourth frequency equation may be defined with divider 818 dividing by either 7 or 11. In general, different frequency equations may be defined for different values of delta between $N_L$ and $N_H$, or $\Delta = N_H - N_L$, where $\Delta$ is equal to 1, 2, 3 and 4 in the design above. For each frequency equation, the percentage of time to divide by $N_L$ and the percentage of time to divide by $N_H$ are determined by $Frac_k$, which is dependent on the divider ratio $N_k$ as well as the values of $N_L$ and $N_H$. The values of $N_L$ and $N_H$ for the selected frequency channel may be indicated by the N_Select signal, which may be provided to unit 832 and divider 818.

In another design, sigma-delta modulator 830 or 930 receives the L-bit $Frac_k$ from divider control unit 832 or 932 and generates a Q-bit divider select signal for divider 818 or 918, where Q may be any integer value greater than one. Divider 818 or 918 may divide the prescaled signal by one of $2^Q$ possible integer divider ratios, as determined by the Q-bit divider select signal. Different frequency equations may be defined for different values of Q. Different frequency equations may also be defined in other manners.

Different frequency equations may provide different performance with respect to spurs. In one design, one frequency equation (e.g., with $\Delta = 1$) may be used as a default frequency equation. For each frequency channel observing excessive degradation due to spurs with the default frequency equation, each of the remaining frequency equations may be evaluated. The frequency equation that provides the best performance with respect to spurs and possibly other factors may be selected for the frequency channel. Performance may be quantified by various metrics such as SNR, error vector magnitude (EVM), bit error rate (BER), packet error rate (PER), etc. EVM is a measure of magnitude and phase errors of modulation symbols due to errors in a transmit LO signal, where the errors may be due to spurs. In general, phase noise of the LO signal may be worse for larger values of $\Delta$ at certain offset frequencies, but the improvement due to mitigation of spurs may more than offset the degradation in phase noise and may improve performance.

In yet another aspect, different frequency division schemes may be available, and a suitable frequency division scheme may be selected for each frequency channel. A frequency division scheme includes a specific value for each divider ratio used to divide the VCO signal in frequency. In the designs shown in FIGS. 8 and 9, the overall divider ratio $R_k$ for frequency channel k may be expressed as:

$$R_k = \frac{f_{VCO}}{f_{ref}} = M_k \cdot P_k \cdot N_k. \quad \text{Eq (10)}$$

A frequency division scheme is defined by a specific value for each of the divider ratios $M_k$, $P_k$ and $N_k$. Different frequency division schemes may be defined with different sets of values for $M_k$, $P_k$ and $N_k$ for a given value of $R_k$. In one design, T different frequency division schemes may be defined with T prescaler ratios $P_1$ through $P_T$. $N_k$ may be modified accordingly for each prescaler ratio. As an example, for a given VCO frequency $f_{VCO}$, prescaler ratios of 8/9 and 4/5 result in different prescaled signal frequencies $f_{PRE}$, which in turn result in different divider ratios $N_k$. In another design, different frequency division schemes may be defined with different integer divider ratios $M_k$. A larger value of $M_k$ results in the selected prescaler operating at a lower frequency, which may save power. In general, different frequency division schemes may be defined for frequency channel k with different values of $P_k$ and/or different values of $M_k$. For each set of values for $P_k$ and $M_k$, $N_k$ may be selected to obtain the desired overall divider ratio $R_k$ for frequency channel k.

Different frequency division schemes may have different spurs and/or different spur levels. A frequency division scheme may be selected for each frequency channel to achieve good performance for that frequency channel. In one design, a set of default values may be used for $P_k$ and $M_k$. For each frequency channel observing excessive degradation due to spurs with the default set of values for $P_k$ and $M_k$, other possible sets of values for $P_k$ and $M_k$ may be evaluated. The frequency division scheme that provides good performance (e.g., the lowest spur levels) may be selected for the frequency channel.

In yet another aspect, either a high side LO signal or a low side LO signal may be used for frequency conversion in a super-heterodyne receiver or transmitter to avoid spurs. For super-heterodyne receiver 220y in FIG. 4, the received signal may be downconverted from RF to IF by mixer 414 with the LO signal $V_{RX\_LO1}$. The frequency of this LO signal is higher than the selected frequency channel for high side injection and is lower than the selected frequency channel for low side injection. The frequency of the LO signal for high side and low side injection may be expressed as:

$$f_{RX\_LO1\_HS} = f_{CH} + f_{IF}, \text{ and}$$

$$f_{RX\_LO1\_LS} = f_{CH} - f_{IF}, \quad \text{Eq (11)}$$

where $f_{IF}$ is the IF frequency,
$f_{CH}$ is the center frequency of the selected frequency channel,
$f_{RX\_LO1\_HS}$ is the LO frequency for high side injection, and
$f_{RX\_LO1\_LS}$ is the LO frequency for low side injection.

High side and low side LO signals may be obtained by selecting appropriate values for the overall divider ratio $R_k$. For each frequency channel, the spur levels with the high side LO signal may be compared against the spur levels with the low side LO signal. The LO signal with lower spur levels may be selected for the frequency channel.

In yet another aspect, different supply voltages may be used for VCO 740, divider 750, and/or other blocks in PLL 700 in order to mitigate the adverse effects of spurs. VCO 740 may be operated at one of multiple possible supply voltages, e.g., 1.8 Volts (V), 2.0 V, 2.2 V, etc. A low supply voltage may save power whereas a high supply voltage may increase VCO signal swing. A system may have stringent specifications at certain offset frequencies, e.g., 400 KHz and 1.8 MHz for GSM. When large spurs are located far away from the PLL loop bandwidth, adjusting the PLL loop bandwidth may have marginal impact. Instead, increasing the supply voltage for VCO 740 may increase the VCO signal swing, which may then sharpen the transition edges of the VCO signal and reduce the effects due to the spurs. A larger VCO supply voltage may be used when needed, e.g., when spurs of sufficiently high levels are located within frequency ranges with stringent specifications. A lower VCO supply voltage may be used in other scenarios to save power. In general, the VCO signal swing may be adjusted by adjusting the VCO supply voltage, a VCO bias current, a bias resistor with a fixed VCO supply voltage, etc., or any combination thereof.

All or part of divider 750 may be operated at one of multiple possible supply voltages. The integer divider, prescaler, fractional-N divider, sigma-delta modulator and/or divider control unit may be sources of large spurs. For each block that may be a source of large spurs, the supply voltage for that block may be controlled to reduce the magnitude of the spurs generated by the block. Variable supply voltages may be applied to the integer divider, prescaler, fractional-N divider, sigma-delta modulator, divider control unit, or any combination thereof. The variable supply voltages may be dependent on the selected frequency channel.

FIG. 10 shows a design of a table 1000 of PLL settings for different frequency channels with non-uniform frequency programming. Table 1000 may be generated for all frequency channels supported by wireless device 110 and may include one entry or rows for each supported frequency channel. A frequency channel may be for the downlink (receiver) or uplink (transmitter) in a specific system. Table 1000 may also include columns for different PLL settings, which may be for circuit blocks within a PLL as well as circuit blocks (e.g., VCO) external to the PLL. In the design shown in FIG. 10, table 100 includes one column for PLL loop bandwidth, one column for frequency equation (e.g., divider ratios $N_L$ and $N_H$ as shown in table 1000, or divider ratios $Z_L$ and $Z_H$), one column for frequency division scheme (e.g., divider ratios $M_k$ and $P_k$), one column to indicate low side or high side injection, one column for overall divider ratio $R_k$, and one column for VCO supply voltage. For each frequency channel, a suitable value may be selected for the parameter(s) in each column to achieve good performance for that frequency channel. For each frequency channel, the desired PLL loop bandwidth may be obtained via the PFD_Control for phase frequency detector 710, the CP_Control for charge pump 720, and/or the LF_Control for loop filter 730.

For each frequency channel, the overall divider ratio $R_k$ may be selected to obtain the desired LO frequency. For a super-heterodyne receiver or transmitter, $R_k$ may also be selected based on whether high side or low side injection is selected for the frequency channel. For each frequency channel, the divider ratios $N_L$ and $N_H$ (or $Z_L$ and $Z_H$) may be obtained based on the frequency equation selected for that frequency channel from among all available frequency equations. For each frequency channel, the divider ratios $P_k$ and/or $M_k$ may be obtained based on the frequency division scheme selected for that frequency channel from among all available frequency division schemes. The values of $N_L$, $N_H$, $P_k$ and $M_k$ may be provided to divider 750 via the Divider_Control. For each frequency channel, the VCO supply voltage may be selected from among multiple available supply voltages, and the selected supply voltage may be indicated by the VR_Control.

FIG. 10 shows a design of a table that may be used to store PLL settings for different frequency channels with non-uniform frequency programming. The low side or high side injection column and the overall divider ratio column may be omitted since the information in these columns may be incorporated in the divider ratios $N_L$, $N_H$, $P_k$ and $M_k$. In general, the PLL settings for the supported frequency channels may be stored using any data structure.

Figure 11:
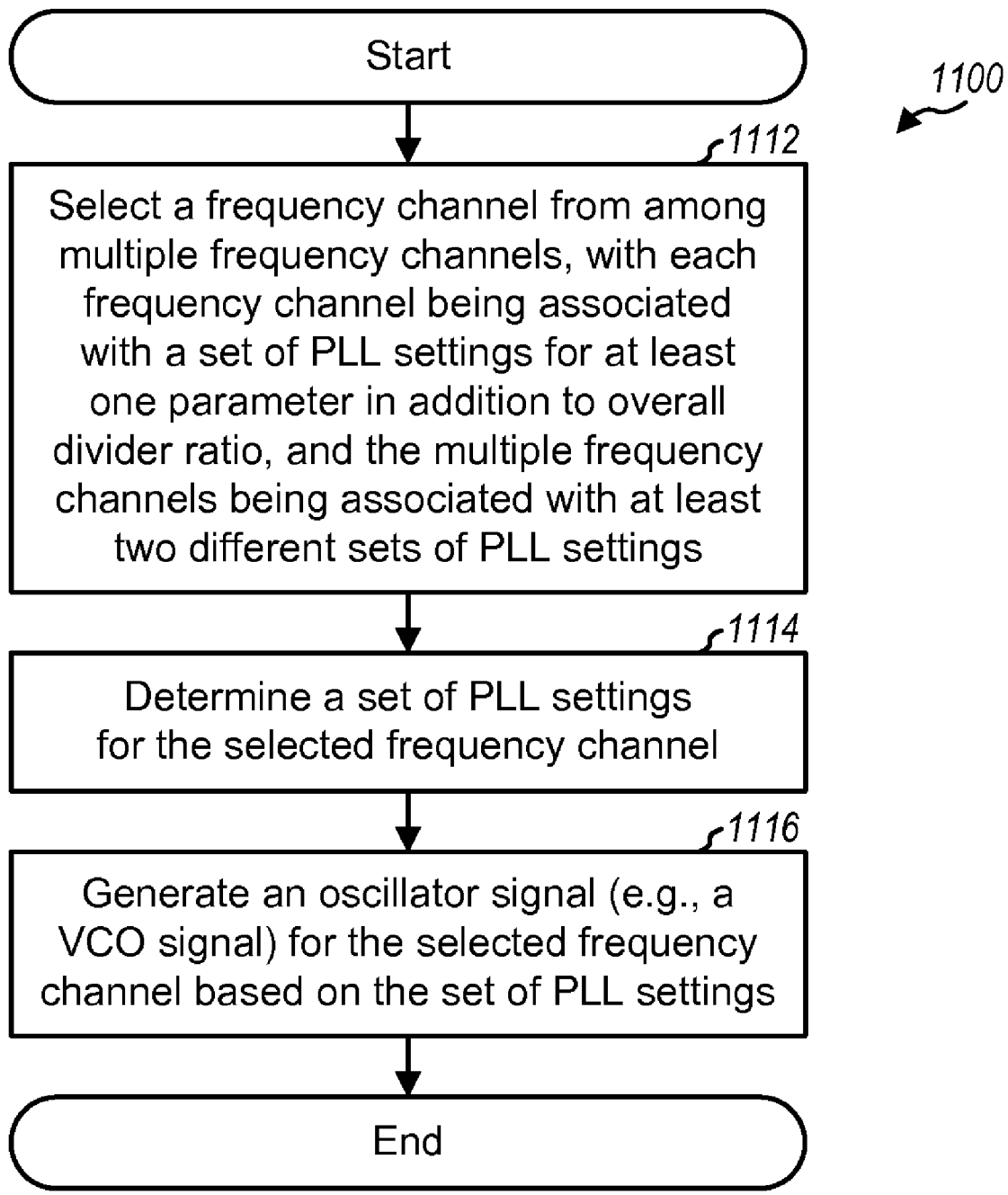
FIG. 11 shows a process for generating an oscillator signal for a frequency channel.

FIG. 11 shows a design of a process 1100 for generating an oscillator signal, e.g., a VCO signal. A frequency channel may be selected from among multiple frequency channels (block 1112). Each frequency channel may be associated with a set of PLL settings for at least one parameter in addition to overall divider ratio $R_k$, which may be inherently different for different frequency channels. The multiple frequency channels may be associated with at least two different sets of PLL settings. A set of PLL settings for the selected frequency channel may be determined, e.g., from a frequency programming table such as table 1000 in FIG. 10 (block 1114). The oscillator signal for the selected frequency channel may be generated based on the set of PLL settings (block 1116).

The set of PLL settings for the selected frequency channel may comprise a setting selecting one of multiple PLL loop bandwidths. One or more blocks within the PLL may be set to achieve a PLL loop bandwidth for the selected frequency channel. The set of PLL settings for the selected frequency channel may comprise a setting selecting one of multiple different amounts of charge pump current. A control signal for a VCO may be generated based on the amount of charge pump current for the selected frequency channel.

The set of PLL settings for the selected frequency channel may comprise a divider setting selecting one of multiple frequency equations, which may be associated with different sets of high and low divider ratios. A divider may be programmed with a set of high and low divider ratios for the selected frequency channel. The divider may then divide the oscillator signal in frequency based on this set of high and low divider ratios.

The set of PLL settings for the selected frequency channel may comprise a frequency division setting selecting one of multiple frequency division schemes for dividing the oscillator signal in frequency. The multiple frequency division schemes may be associated with different prescaler ratios, different integer divider ratios, etc. The oscillator signal may be divided in frequency based on a prescaler ratio and/or an integer divider ratio for the selected frequency channel.

The set of PLL settings for the selected frequency channel may comprise a setting selecting either high side or low side injection for an LO signal, which may be generated based on the oscillator signal. The LO signal may be generated at a frequency higher than the selected frequency channel if high side injection is selected or at a frequency lower than the selected frequency channel if low side injection is selected.

The set of PLL settings for the selected frequency channel may comprise a setting selecting one of multiple supply voltages for a circuit block such as a VCO, a divider, etc. A supply voltage chosen for the selected frequency channel may be generated and applied to the circuit block. The set of PLL settings for the selected frequency channel may comprise a setting for a bias current control for the circuit block. The bias current control chosen for the selected frequency channel may be generated and applied to the circuit block. In general, a PLL setting may select one of multiple biasing schemes for a circuit block, and the multiple biasing schemes may correspond to different supply voltages, or different bias currents, or both for the circuit block.

The sets of PLL settings for the multiple frequency channels may also be for different and/or additional parameters.

The oscillator signal generation techniques described herein may provide certain advantages. First, by using different PLL settings for different frequency channels, the adverse effects due to spurs may be mitigated, and good performance may be achieved for each frequency channel. Second, the techniques may allow for integration of digital and analog circuits on the same IC die, which may reduce cost, size, etc.

In another aspect, non-uniform frequency programming may be used to control the operation of the transmitters and/or receivers in wireless device 110. Various parameters of a transmitter or a receiver may be controlled based on the selected frequency channel. For a receiver, the LNA bias current and/or gain, mixer bias current and/or gain, filter bandwidth, VGA gain, etc., may be set based on the selected frequency channel. For a transmitter, the PA bias current and/or gain, mixer bias current and/or gain, filter bandwidth, VGA gain, etc., may be set based on the selected frequency channel. With non-uniform frequency programming, different settings may be used for the blocks within the transmitter or receiver for different frequency channels. A suitable set of transceiver settings may be selected for each frequency channel to achieve good performance for that frequency channel. Each frequency channel may thus be associated with a set of transceiver settings for at least one parameter in the transmitter or receiver in addition to overall divider ratio $R_k$. The different frequency channels may be associated with at least two different sets of transceiver settings. The set of transceiver settings for a selected frequency channel may be applied to the transmitter or receiver.

The techniques described herein may be implemented by various means. For example, the techniques may be implemented in hardware, firmware, software, or a combination thereof. For a hardware implementation, the various blocks described herein may be implemented on one or more ASICs, DSPs, digital signal processing devices (DSPDs), programmable logic devices (PLDs), field programmable gate arrays (FPGAs), processors, controllers, micro-controllers, microprocessors, electronic devices, other electronic units designed to perform the functions described herein, a computer, or a combination thereof.

The circuits described herein (e.g., frequency synthesizers 270 and 700, LO generators 272 and 760, PLL 702, etc.) may be implemented on an IC, an RFIC, a mixed-signal IC, an ASIC, a printed circuit board (PCB), etc. The circuits may also be fabricated with various IC process technologies such as CMOS, N-channel MOS (N-MOS), P-channel MOS (P-MOS), bipolar junction transistor (BJT), bipolar-CMOS (BiCMOS), silicon germanium (SiGe), gallium arsenide (GaAs), etc.

Certain aspects of the techniques may be implemented with firmware and/or software (e.g., modules such as procedures, functions, etc.) that perform the functions described herein. The firmware and/or software instructions/code may be stored in a memory (e.g., memory 262 in FIG. 2) and executed by a processor (e.g., processor 260). The memory may be implemented within the processor or external to the processor. The firmware and/or software instructions/code may also be stored in a computer/processor-readable medium such as random access memory (RAM), read-only memory (ROM), non-volatile random access memory (NVRAM), programmable read-only memory (PROM), electrically erasable PROM (EEPROM), FLASH memory, floppy disk, compact disc (CD), digital versatile disc (DVD), magnetic or optical data storage device, etc. The instructions/code may be executable by one or more processors and may cause the processor(s) to perform certain aspects of the functionality described herein.

An apparatus implementing the techniques described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus for wireless communication, comprising:
 a phase-locked loop (PLL) used to generate an oscillator signal for a frequency channel selected from among a first frequency channel and a second frequency channel, each frequency channel being associated with a set of PLL settings for at least one parameter in addition to overall divider ratio, the multiple frequency channels being associated with at least two different sets of PLL settings, and the PLL operating based on the set of PLL settings for the selected frequency channel; and
 a memory comprising the at least two different sets of PLL settings comprising a first set of PLL settings resulting in lower spur levels at the first frequency channel than a second set of PLL settings, the second set of PLL settings resulting in lower spur levels at the second channel frequency than the first set of PLL settings,
 wherein the memory stores a table of the PLL settings for the multiple frequency channels, the PLL settings comprising PLL loop bandwidth settings, frequency equation settings, frequency division scheme settings, low side or high side injection settings, overall divider ratio settings, and VCO biasing settings.

2. The apparatus of claim 1, wherein the set of PLL settings for the selected frequency channel comprises a setting selecting one of multiple PLL loop bandwidths.

3. The apparatus of claim 1, wherein the PLL comprises a charge pump, and wherein the set of PLL settings for the selected frequency channel comprises a setting selecting one of multiple different amounts of charge pump current.

4. The apparatus of claim 1, wherein the set of PLL settings for the selected frequency channel comprises a divider setting selecting one of multiple frequency equations for dividing the oscillator signal in frequency.

5. The apparatus of claim 4, wherein the multiple frequency equations are associated with different sets of high and low divider ratios, and wherein the divider setting indicates a specific set of high and low divider ratios for dividing the oscillator signal in frequency.

6. The apparatus of claim 1, wherein the set of PLL settings for the selected frequency channel comprises a frequency division setting selecting one of multiple frequency division schemes for dividing the oscillator signal in frequency.

7. The apparatus of claim 6, wherein the multiple frequency division schemes are associated with different prescaler ratios, and wherein the frequency division setting indicates a specific prescaler ratio for dividing the oscillator signal in frequency.

8. The apparatus of claim 6, wherein the multiple frequency division schemes are associated with different integer divider ratios, and wherein the frequency division setting indicates a specific integer divider ratio for dividing the oscillator signal in frequency.

9. The apparatus of claim 1, wherein the set of PLL settings for the selected frequency channel comprises a setting selecting either high side or low side injection for a local oscillator (LO) signal generated based on the oscillator signal, and wherein the LO signal has a frequency higher than the selected frequency channel for high side injection and lower than the selected frequency channel for low side injection.

10. The apparatus of claim 1, wherein the set of PLL settings for the selected frequency channel comprises a setting selecting one of multiple biasing schemes for an oscillator used to generate the oscillator signal, the multiple biasing schemes corresponding to different supply voltages, or different bias currents, or both, for the oscillator.

11. The apparatus of claim 1, wherein the multiple frequency channels comprise at least one of multiple Code Division Multiple Access (CDMA) channels and multiple Global System for Mobile Communications (GSM) channels.

12. An integrated circuit comprising:
 a phase-frequency detector for receiving a reference signal and a feedback signal and providing a detector signal indicative of phase difference between the reference signal and the feedback signal;
 a charge pump for generating an error signal based on the detector signal;
 a loop filter for filtering the error signal and providing a control signal for an oscillator;
 a divider for receiving an oscillator signal from the oscillator, dividing the oscillator signal in frequency, and providing the feedback signal, wherein at least one of the charge pump, the loop filter, and the divider has multiple settings for a parameter other than overall divider ratio, the multiple settings being selectable for each of multiple frequency channels and comprising a first set of settings resulting in lower spur levels at a first frequency channel than a second set of settings, the second set of settings resulting in lower spur levels at a second channel frequency than the first set of settings; and
 a memory storing a table of the PLL settings for the multiple frequency channels, the PLL settings comprising PLL loop bandwidth settings, frequency equation settings, frequency division scheme settings, low side or high side injection settings, overall divider ratio settings, and VCO biasing settings.

13. The integrated circuit of claim 12, wherein the divider comprises a fractional-N divider having multiple settings for different sets of high and low divider ratios used to divide the oscillator signal in frequency.

14. The integrated circuit of claim 12, wherein the divider has multiple settings for multiple prescalers, and wherein one of the multiple prescalers is selected for each frequency channel to divide the oscillator signal in frequency.

15. The integrated circuit of claim 12, wherein the divider comprises an integer divider having multiple settings for different integer divider ratios used to divide the oscillator signal in frequency.

16. The integrated circuit of claim 12, wherein the charge pump has multiple settings for different amounts of charge pump current.

17. A method comprising:
 selecting a frequency channel from among multiple frequency channels, each frequency channel being associated with a set of phase-locked loop (PLL) settings for at least one parameter in addition to overall divider ratio, the multiple frequency channels being associated with at least two different sets of PLL settings;
 storing a set of PLL settings in a table in a memory to reduce spur levels for the selected frequency channel, the PLL settings comprising PLL loop bandwidth settings, frequency equation settings, frequency division scheme settings, low side or high side injection settings, overall divider ratio settings, and VCO biasing settings; and generating an oscillator signal for the selected frequency channel based on the set of PLL settings.

18. The method of claim 17, wherein the set of PLL settings for the selected frequency channel comprises a setting selecting one of multiple sets of high and low divider ratios, and wherein the generating the oscillator signal for the selected frequency channel comprises
   programming a divider with a set of high and low divider ratios for the selected frequency channel, and
   dividing the oscillator signal in frequency based on the set of high and low divider ratios.

19. The method of claim 17, wherein the set of PLL settings for the selected frequency channel comprises a setting selecting one of multiple prescaler ratios, and wherein the generating the oscillator signal for the selected frequency channel comprises dividing the oscillator signal in frequency based on a prescaler ratio for the selected frequency channel.

20. The method of claim 17, wherein the set of PLL settings for the selected frequency channel comprises a setting selecting either high side or low side injection, and wherein the generating the oscillator signal for the selected frequency channel comprises
   generating the oscillator signal to obtain a local oscillator (LO) signal with a frequency higher than the selected frequency channel if high side injection is selected for the selected frequency channel, and
   generating the oscillator signal to obtain an LO signal with a frequency lower than the selected frequency channel if low side injection is selected.

21. The method of claim 17, wherein the set of PLL settings for the selected frequency channel comprises a setting selecting one of multiple different amounts of charge pump current, and wherein the generating the oscillator signal for the selected frequency channel comprises generating a control signal for an oscillator based on an amount of charge pump current for the selected frequency channel, the oscillator generating the oscillator signal.

22. The method of claim 17, wherein the set of PLL settings for the selected frequency channel comprises a setting selecting one of multiple supply voltages for an oscillator used to generate the oscillator signal, the method further comprising:
   applying a supply voltage chosen for the selected frequency channel to the oscillator.

23. An apparatus for wireless communication, comprising:
   means for selecting a frequency channel from among multiple frequency channels, each frequency channel being associated with a set of phase-locked loop (PLL) settings for at least one parameter in addition to overall divider ratio and chosen to mitigate the effect of spurs, the multiple frequency channels being associated with at least two different sets of PLL settings;
   means for storing a set of PLL settings in a table in a memory to reduce spur levels for the selected frequency channel, the PLL settings comprising PLL loop bandwidth settings, frequency equation settings, frequency division scheme settings, low side or high side injection settings, overall divider ratio settings, and VCO biasing settings; and
   means for generating an oscillator signal for the selected frequency channel based on the set of PLL settings.

24. An apparatus for wireless communication, comprising:
   a controller configured to determine a frequency channel selected from among multiple frequency channels, to determine a set of transceiver settings to reduce spur levels for the selected frequency channel, and to apply the set of transceiver settings for the selected frequency channel to a transmitter or a receiver, wherein each frequency channel is associated with a set of transceiver settings for at least one parameter in the transmitter or receiver in addition to overall divider ratio, the multiple frequency channels being associated with at least two different sets of transceiver settings; and
   a memory storing a table of the transceiver settings for the multiple frequency channels, the transceiver settings comprising PLL loop bandwidth settings, frequency equation settings, frequency division scheme settings, low side or high side injection settings, overall divider ratio settings, and VCO biasing settings.

25. A non-transitory computer-readable medium having instructions stored thereon, which when executed by a processor, causes the following to occur:
   selecting a frequency channel from among multiple frequency channels, each frequency channel being associated with a set of phase-locked loop (PLL) settings for at least one parameter in addition to overall divider ratio, the multiple frequency channels being associated with at least two different sets of PLL settings;
   determining a set of PLL settings to reduce spur levels for the selected frequency channel;
   retrieving the set of PLL settings stored in a table in a memory, the set of PLL settings comprising PLL loop bandwidth settings, frequency equation settings, frequency division scheme settings, low side or high side injection settings, overall divider ratio settings, and VCO biasing settings; and
   generating an oscillator signal for the selected frequency channel based on the set of PLL settings.

\* \* \* \* \*